United States Patent
Baselmans et al.

(10) Patent No.: US 7,230,677 B2
(45) Date of Patent: Jun. 12, 2007

(54) LITHOGRAPHIC APPARATUS AND DEVICE MANUFACTURING METHOD UTILIZING HEXAGONAL IMAGE GRIDS

(75) Inventors: Johannes Jacobus Matheus Baselmans, Oirschot (NL); Patricius Aloysius Jacobus Tinnemans, Hapert (NL); Willem Jurrianus Venema, Eindoven (NL)

(73) Assignee: ASML Netherlands B.V., Veldhoven (NL)

( * ) Notice: Subject to any disclaimer, the term of this patent is extended or adjusted under 35 U.S.C. 154(b) by 128 days.

(21) Appl. No.: 11/018,929

(22) Filed: Dec. 22, 2004

(65) Prior Publication Data

US 2006/0132746 A1    Jun. 22, 2006

(51) Int. Cl.
    *G03B 27/54*    (2006.01)
(52) U.S. Cl. .......................................... 355/67; 355/71
(58) Field of Classification Search .................. 355/67, 355/71
    See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,016,185 A * | 1/2000 | Cullman et al. | 355/52 |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2003/0112523 A1 * | 6/2003 | Daniell | 359/626 |
| 2004/0041104 A1 | 3/2004 | Liebregts et al. | |
| 2004/0130561 A1 | 7/2004 | Jain | |
| 2004/0196526 A1 * | 10/2004 | Roxlo et al. | 359/291 |
| 2005/0007572 A1 | 1/2005 | George et al. | |
| 2005/0275840 A1 * | 12/2005 | Gui et al. | 356/400 |

FOREIGN PATENT DOCUMENTS

| WO | WO 98/33096 | 7/1998 |
|---|---|---|
| WO | WO 98/38597 | 9/1998 |

* cited by examiner

*Primary Examiner*—D. Rutledge
(74) *Attorney, Agent, or Firm*—Sterne Kessler Goldstein & Fox PLLC

(57) ABSTRACT

An apparatus and system that form a hexagonal exposed spot grid on a substrate. This is accomplished by using a patterning device that directs a patterned beam onto a microlens array, which forms Fourier transformed spots of the pattered beam at the substrate. Through at least one of (a) moving of the substrate that is patterned by the patterning device and/or changing a frequency of a beam of radiation or (b) through a hexagonal configuration of the patterning device and the microlens array, the spots from the microlens array form the hexagonal exposed spot grid on the substrate.

16 Claims, 13 Drawing Sheets

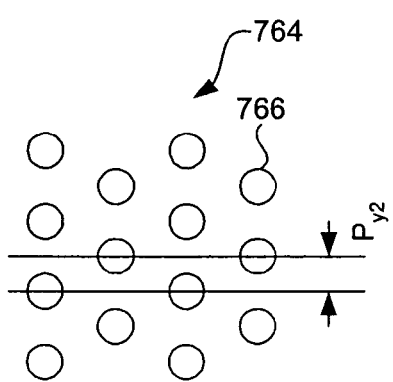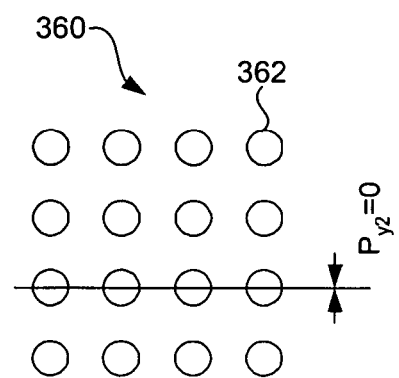
FIG. 9                  FIG. 5

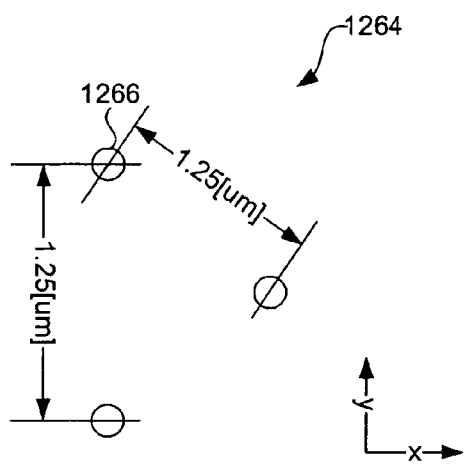
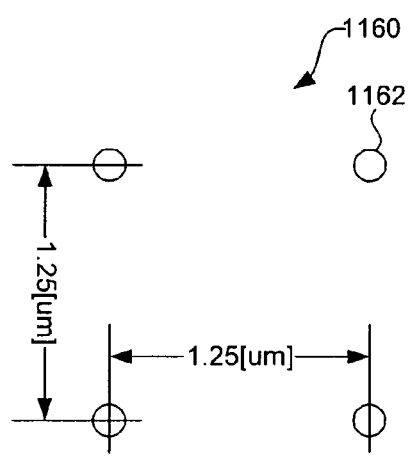
FIG. 12  FIG. 11

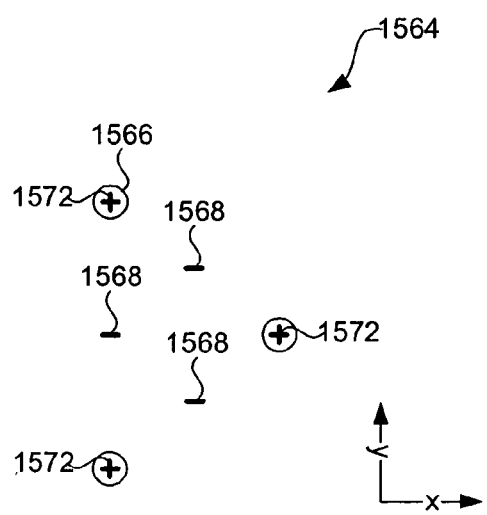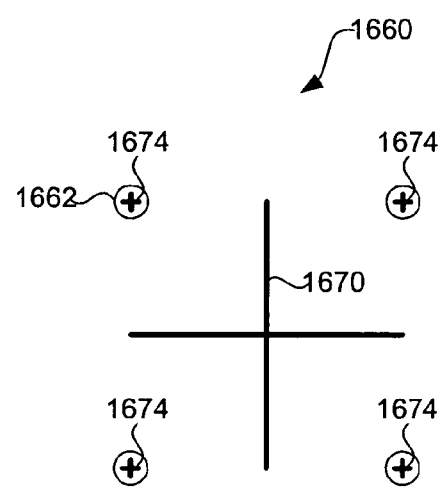
FIG. 15       FIG. 16

LITHOGRAPHIC APPARATUS AND DEVICE MANUFACTURING METHOD UTILIZING HEXAGONAL IMAGE GRIDS

BACKGROUND

1. Field of the Invention

The present invention relates to a lithographic apparatus and a device manufacturing method.

2. Related Art

A lithographic apparatus is a machine that applies a desired pattern onto a target portion of a substrate (e.g., a workpiece, an object, a display, etc.). The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern. This is referred to as maskless lithography.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

Another way of imaging includes pixel grid imaging, in which a pattern is realized by successive exposure of spots.

Therefore, what is needed is a system and method that is used to improve maskless lithography techniques.

SUMMARY

According to an embodiment of the present invention, there is provided a system, comprising a source of radiation, a patterning device, a projection system, and a microlens array. The source of radiation produces a beam of radiation. The patterning device patterns the beam. The projection system projects the patterned beam onto target portions of a substrate. The projection system includes a microlens array positioned proximate the substrate and configured to form a substantially hexagonal grid pattern on the substrate.

Another embodiment of the present invention provides a method comprising the following steps. Patterning a beam of radiation from a source of radiation using a patterning device. Projecting the patterned beam onto target portions of a substrate using a projection system. Forming a substantially hexagonal grid pattern on the substrate using a microlens array in the projection system that is positioned proximate the substrate.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1 and 2 depict exemplary lithography systems, according to various embodiments of the present invention.

FIGS. 3, 4, 5, and 6 show parameters of a square grid pattern formed on a substrate, according to one embodiment of the present invention.

FIGS. 7, 8, 9, and 10 show parameters of a substantially grid pattern, according to one embodiment of the present invention.

FIG. 11 shows an example rectangular spot grid geometry between spots, according to one embodiment of the present invention.

FIG. 12 shows an example hexagonal spot grid geometry with spots, according to one embodiment of the present invention.

FIGS. 15 and 16 show a distribution of worst case positions and best case positions in both a hexagonal and rectangular grid, respectively, according to embodiments of the present invention.

The present invention will now be described with reference to the accompanying drawings. In the drawings, like reference numbers can indicate identical or functionally similar elements.

DETAILED DESCRIPTION

Figure 1:
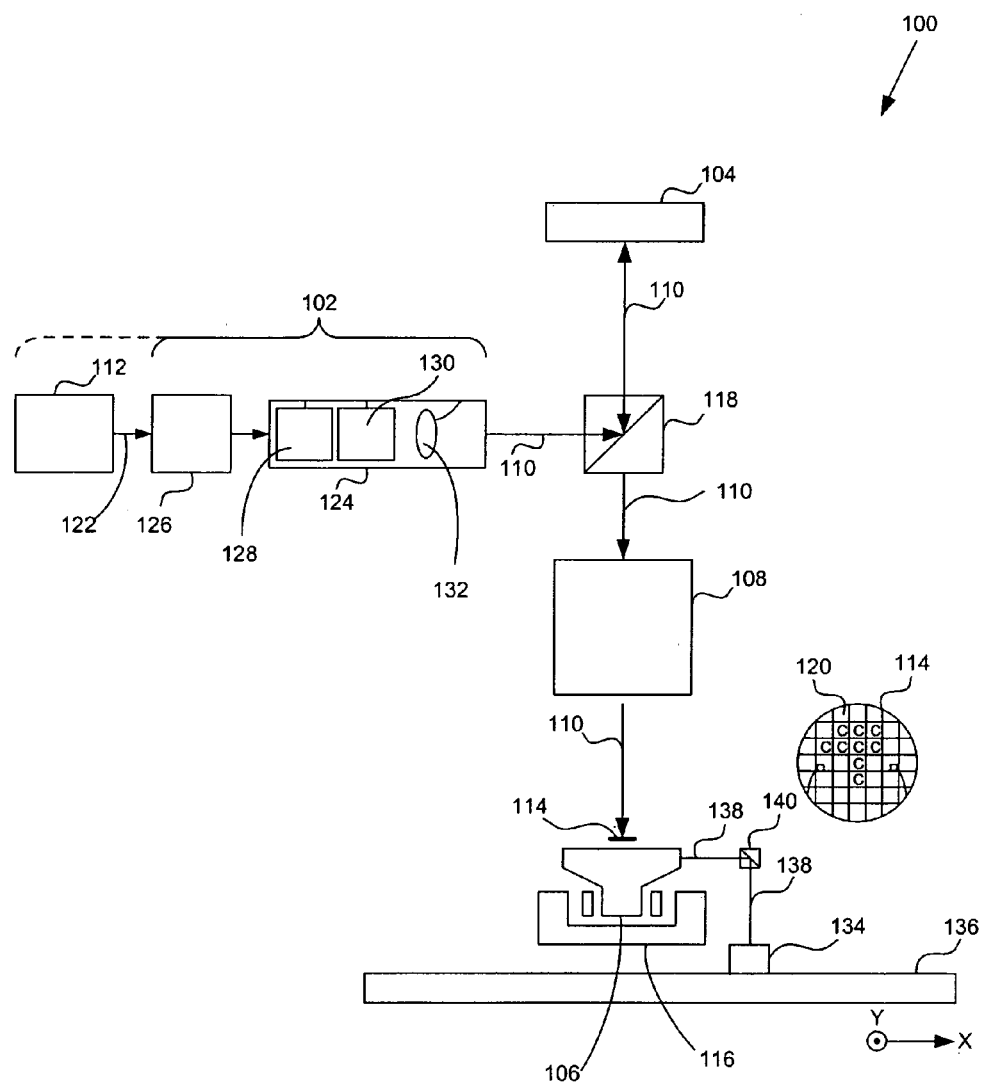

One or more of the embodiments of the present invention include an apparatus and system that form a hexagonal exposed spot grid on a substrate. This is accomplished by using a patterning device that directs a patterned beam onto a microlens array, which forms Fourier transformed spots of the pattered beam at the substrate. Through moving of the substrate and/or a frequency of a beam of radiation that is patterned by the patterning device or through a hexagonal configuration of the patterning device and the microlens array, the spots from the microlens array form the hexagonal exposed spot grid on the substrate.

In various examples, using a hexagonal exposed spot grid can allow for a better fill factor compared to a rectangular exposed spot grid, which can results in less influence of the sub exposed spot grid position when imaging a feature and less influence of a rotation of the image feature to the resulting aerial image.

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the filter can filter out the diffracted light, leaving the undiffracted light to reach the substrate. In this manner, the beam becomes patterned according to the addressing pattern of the matrix-addressable surface. It will be appreciated that, as an alternative, the undiffracted light can be filtered out of the reflected beam, leaving only the diffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. A programmable LCD array can also be used. It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Exemplary Lithographic Projection Tools

Figure 2:
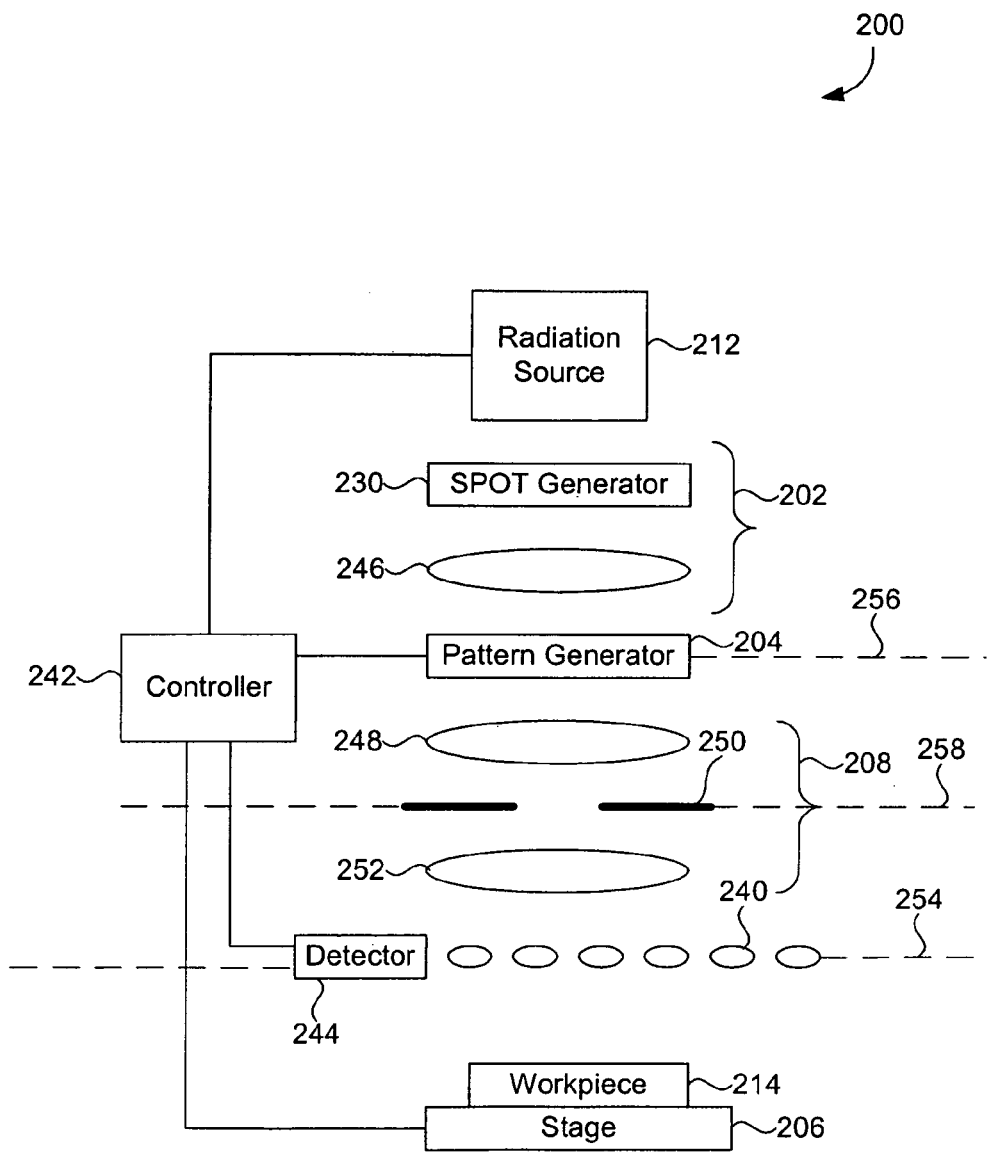
Figure 7:
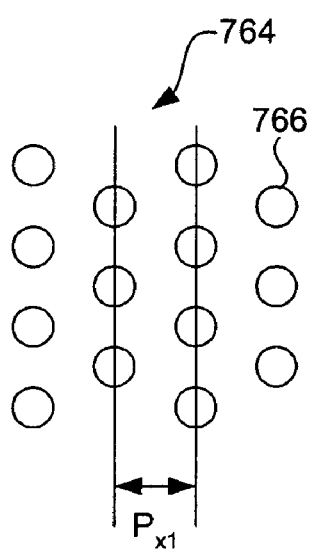

FIGS. 1 and 2 depict exemplary lithography systems 100 and 200, according to various embodiments of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., a frequency tripled Nd:YAG laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

It should be noted, with regard to FIG. 1, that source 112 can be within the housing of lithographic projection apparatus 100. In alternative embodiments, source 112 can also be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in five modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

FIG. 2 shows another exemplary lithography system 200, according to one embodiment of the present invention. System 200 includes a radiation source 212, an illumination system 202, a patterning device 204, a projection system 208, a microlens array 240, a workpiece 214, and a stage 206. Also, a controller 242 is coupled between stage 206 and source 212 and a detector 244 is coupled to controller 242. As discussed above, radiation emitted from source 212 is directed using illumination system 202, for example having a spot generator 230 an optical device 246, onto a patterning device 204 to be patterned. The patterned light is projected using projection system 208, for example including a converging lens 248, an aperture 250, and a lens 252, through microlens array 240 onto target portions (not shown) on substrate 214.

In one example, microlens array 240 is positioned at an plane 254 conjugate to an object plane 256, e.g., plane 254 is an image plane. An example lithography system configured this way can be found in U.S. application Ser. No. 11/013,938 filed Dec. 17, 2004 (now U.S. Pat. No. 7,180,577) that issued Feb. 20, 2007), which in incorporate by reference herein in its entirety.

In another example, microlens array 240 is positioned at plane 254 conjugate to a pupil plane 258 of projection system 208, while substrate 214 is positioned at an image plane. An example lithography system configured this way can be found in U.S. application Ser. No. 10/939,947, filed Sep. 14, 2004 (now U.S. Pat. No. 7,079,225 that issued Jul. 18, 2006), which is incorporated herein by reference in its entirety.

In one example, patterning device 204 includes an array of individually controllable elements that are controlled using pattern data to pattern an impinging beam of radiation.

Example Rectangular Exposed Spot Grid Parameters

FIGS. 3, 4, 5, and 6 show parameters of a rectangular or square grid pattern 360 formed on a substrate (not shown), according to one embodiment of the present invention. With reference to these figures, and continuing reference to FIG. 2, when patterning device 204 has the array of individually controllable elements formed as a square or rectangular grid and microlens array 240 is a square grid of lenses, a rectangular or square spot grid 360 is formed on substrate 214.

Figure 3:
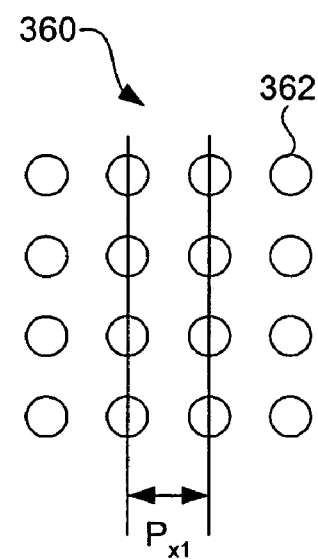
Figure 8:
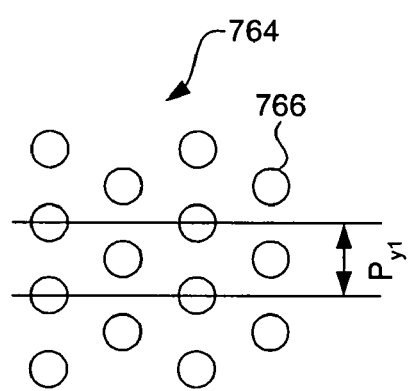

As shown in FIG. 3, an x-distance $P_{x1}$ between neighboring exposed spots 362 is defined by:

$$p_{x1} = \sin(\alpha_{MLA}) \cdot p_{MLA,y}$$

$$p_{x1} \approx \alpha_{MLA} \cdot p_{MLA}$$

In these formulas, $p_{MLA,y}$ indicates a pitch between two neighboring spots 362 of microlens array 240 in the y-direction (scan direction), $\alpha_{MLA}$ indicates an angle of microlens array 240 with respect to the scan direction (y-axis) and $p_x$ indicates the distance in the x-direction between two resulting neighboring exposed spots 362. In one example, the angle $\alpha_{MLA}$ is very small (e.g., a few mrad) the bottom formula approximation is also accurate.

Figure 4:
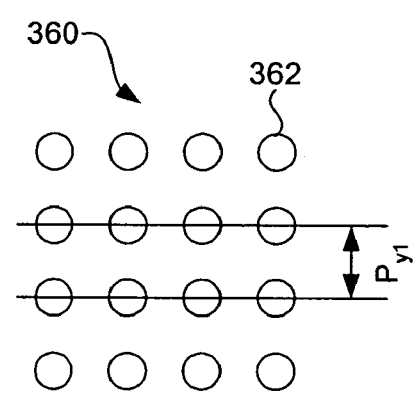

As shown in FIG. 4, in one example a y-distance $P_{y1}$ between neighboring exposed spots 362 with the same MLA spot parent from the same MLA column is defined by:

$$p_{y1} = \frac{v_{stage}}{f_{laser}},$$

In this equation, $v_{stage}$ is the stage y-velocity and $f_{laser}$ is the laser frequency.

As shown in FIG. 5, in one example a y-distance $P_{y2}$ between neighboring exposed spots 362 with a different MLA spot parent from the same MLA column is defined by:

$$p_{y2} = [\cos(\alpha_{MLA}) \cdot p_{MLA}] \mod\left[\frac{v_{stage}}{f_{laser}}\right]$$

$$p_{y2} = [\cos(\alpha_{MLA}) \cdot p_{MLA}] \mod[p_{y1}]$$

$$p_{y2} \approx [p_{MLA}] \mod[p_{y1}]$$

In one example, the angle $\alpha_{MLA}$ can be very small (e.g., only a few mrad).

Figure 6:
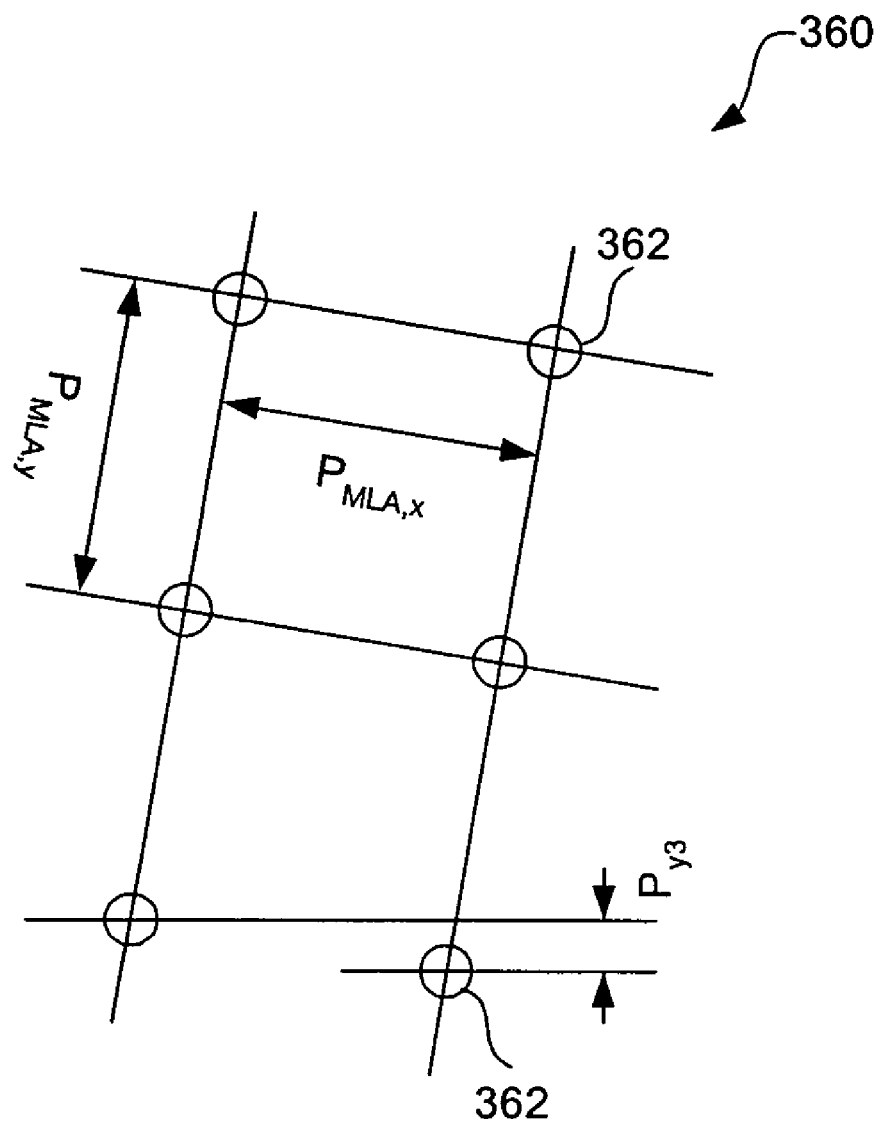
Figure 10:
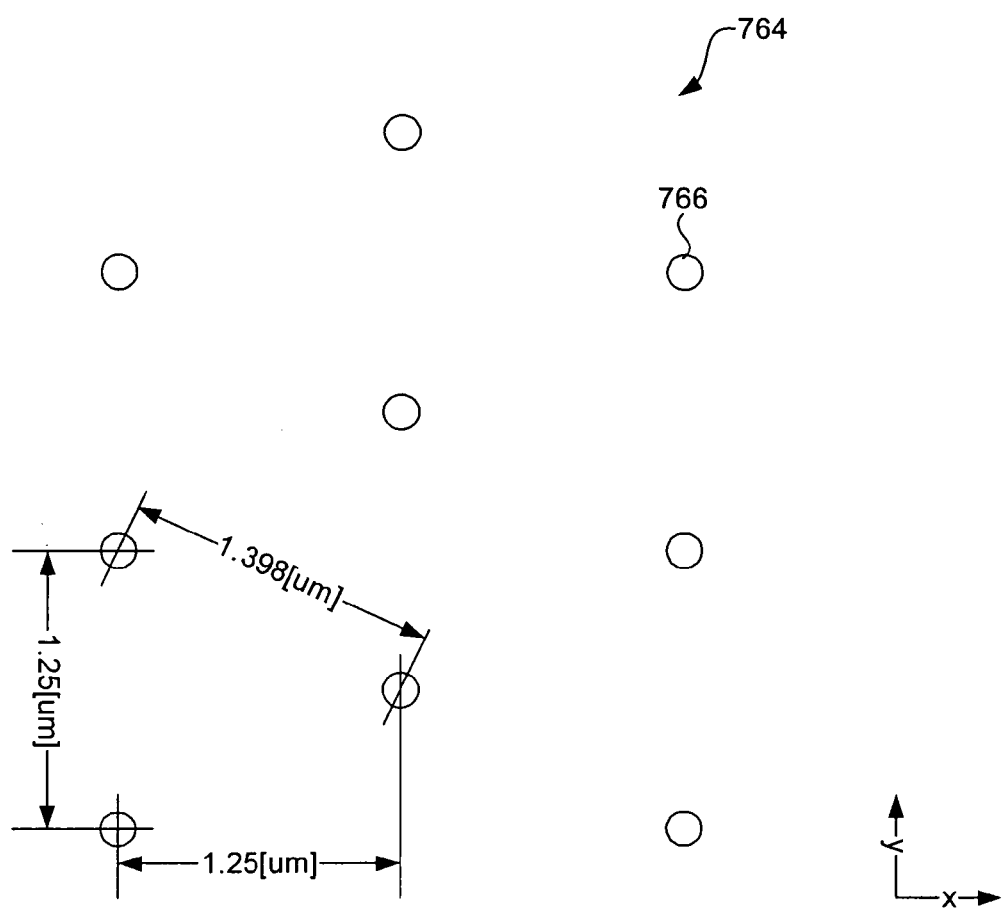

As shown in FIG. 6, in one example a y-distance $P_{y3}$ between exposed spots 362 with a different MLA spot parent from a different MLA column (e.g., over an intra MLA seam) is defined by:

$$p_{y3} = \sin(\alpha_{MLA}) \cdot p_{MLA,x}$$

Example Hexagonal Exposed Spot Grid Parameters

FIGS. 7, 8, 9, and 10 show a hexagonal, substantially hexagonal, or quasi-hexagonal (hereinafter all referred to as "hexagonal") grid 764 having spots 766, according to one embodiment of the present invention. The pitches between spots 766 in the x-direction Px and y-direction $P_{y1, y2, y3}$ are defined using the same formulas shown above.

In one example, the hexagonal environment, neighboring spots 766 are printed at different time intervals, for example 200 spots 766 are printed before one spot 766 is printed next to another spot 766. Thus, spots 766 are move by ½ a pitch, a hexagonal grid is formed. This can result from a small scan speed change, for example, because only ½ of a pitch is added each 200 spots.

With reference to these figures, and continuing reference to FIG. 2, in one example, hexagonal grid 764 is formed when patterning device 204 has the array of individually controllable elements formed as a hexagonal grid and microlens array 240 is a hexagonal grid of lenses. In another example, forming hexagonal grid 764 requires a change in design with respect a velocity of stage 206 only (i.e., $v_{stage}$), a frequency of radiation source 212 only (i.e., $f_{laser}$), or a combination thereof. This is accomplished using controller 242 coupled to radiation source 212 and stage 206.

For example, the stage velocity $v_{stage}$ is increased or decreased by a small amount. In a case having a MLA spot pitch of 320 μm in both the x and y directions and a nominal stage speed of about 62.5 mm/s, a change in stage velocity $v_{stage}$ is about 0.19%, from the equations above, resulting in a stage speed of about 62.622 mm/s instead of the nominal speed of about 62.5 mm/s. In another example, the frequency $f_{laser}$ of laser 212 is nominally about 50 kHz, and is changed by this amount, e.g., about 0.19%, to about 50.95 kHz and the velocity of stage 206 is unchanged. In either case, this allows for a shift in the positioning of neighboring spots 766.

In a hexagonal grid array environment, one or move of the following parameters are present: (1) the x-distance $P_{x1}$ between spots 766 can be defined by the appropriate MLA angle and MLA spot pitch only; (2) the y-distance $P_{y1}$ between spots 766 with the same MLA spot parent is defined by the quotient between the stage speed and the laser frequency only; and/or (3) the y-distance $P_{y2}$ between spots 766 with a different MLA spot parent, from the same MLA column, is a complex function of microlens array angle, MLA spot pitch (x and y independent), stage speed, and the laser frequency.

Example Rectangular Exposed Spot Grid Geometry

FIG. 11 shows an example rectangular spot grid geometry 1160 between spots 1162, according to one embodiment of the present invention. This example has a stage scan speed of about 65 mm/s, a laser frequency of about 50 kHz, and a MLA pitch of about 320 μm in both x and y directions, a MLA angle of about 3.9 mrad, which results in a rectangular exposed spot grid 1160 having an exposed spot pitch $P_{x1}$ and $P_{y1}$ that equals 1.25 μm both in x and y-direction.

Example Hexagonal Exposed Spot Grid Geometry

FIG. 12 shows an example hexagonal spot grid geometry 1264 with spots 1266, according to one embodiment of the present invention. This example has used the above equations to adjust either the nominal stage scan speed of about 65 mm/s to about 66.235 mm/3, the nominal laser frequency of about 50 kHz to about 50.95 kHz, or adjusted each slightly up or down, which results in a hexagonal exposed spot grid 1264 having an exposed spot pitch $P_{x1}$ and $P_{y1}$ that equals 1.25 μm both in x and y-direction.

Exemplary Exposed Spot Grid Performance

To investigate the performance of the exposed hexagonal spot grid, a 2-dimensional Fourier transform of an impulse response of the exposed hexagonal spot grid is determined. This is because if to image an impulse (delta function) with the exposed hexagonal spot grid, a response depends on a sub grid position. A comparison id discussed for the 2-dimensional Fourier transform of the impulse response for the following two cases: (1) a rectangular exposed spot grid, with an exposed spot pitch of about 1.25 μm and (2) a hexagonal exposed spot grid, with an exposed spot pitch of about 1.25 μm.

In these example, at most three exposed spots are used for a hexagonal exposed spot grid and four exposed spots are needed in case of a rectangular exposed spot grid to expose an impulse (delta) pulse. The actual amount is depending on a sub grid position at which the delta pulse is requested.

The generalized Fourier transform, assuming that a spot size if a 2D Gaussian function, of the impulse response for a grid is:

$$\tilde{H} = \sum_{n}^{exposed\ spots} I_n \cdot \exp(-jk_x x_n - jk_y y_n) \cdot \exp\left(\frac{-(k_x^2 + k_y^2) \cdot d_{fwhm}^2}{16 \cdot \ln(2)}\right),$$

where $k_x$ and $k_y$ are the 2-dimensional spatial angular frequencies.

Where $d_{fwhm}$ indicates the full width half maximum of the exposed spots.

Where $I_n$ indicates the exposed spot intensity.

Where $x_n$ and $y_n$ indicates the exposed spot position.

In a "best" case scenario example, an impulse (delta pulse) on each grid may only needs one exposed spot to expose it. The Fourier transform of this best case impulse response of a grid (both hexagonal and rectangular) is:

$$\tilde{H}_{best\ case} = \exp\left(\frac{-(k_x^2 + k_y^2) \cdot d_{fwhm}^2}{16 \cdot \ln(2)}\right).$$

Figure 13:
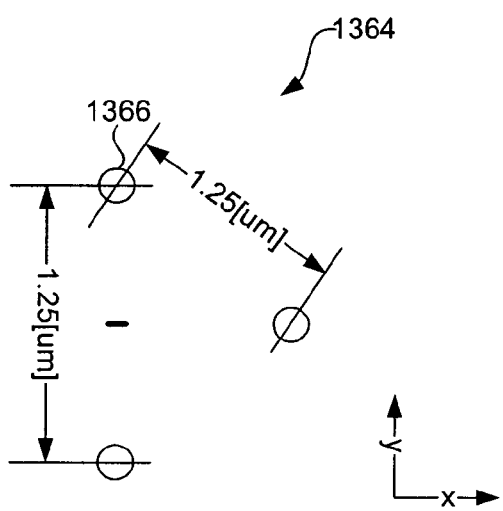
FIGS. 13 and 14 show a "worst" case scenario for hexagonal and rectangular exposed spot grids, respectively, according to embodiments of the present invention.
Figure 14:
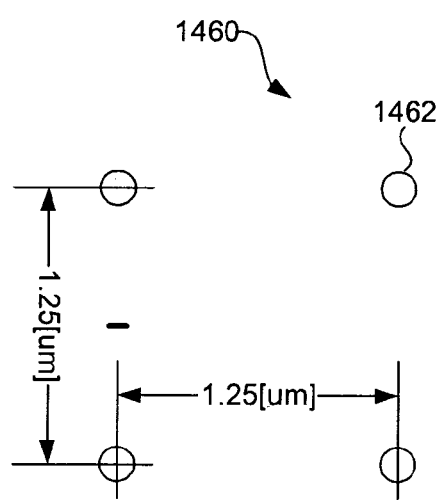

FIGS. 13 and 14 show a "worst" case scenario for hexagonal and rectangular exposed spot grids, respectively, according to one embodiment of the present invention. In a "worst" case scenario, an impulse is requested to be exposed exactly in between two exposed spots (both hexagonal and rectangular). Example of worst case impulse response sub grid positions 1368 and 1470 (marked with a −), respectively, are shown for both hexagonal and rectangular exposed spot grid. A 1-dimensional Fourier transform of this worst case impulse response of a grid (both hexagonal and rectangular) is:

$$\tilde{H}_{worst\ case} = \frac{1}{2} \cdot \exp(-j \cdot 0.5 \cdot k_y p + j \cdot 0.5 \cdot k_y p) \cdot \exp\left(\frac{-(k_x^2 + k_y^2) \cdot d_{fwhm}^2}{16 \cdot \ln(2)}\right),$$

where p indicates the exposed spot pitch.

FIGS. 15 and 16 show a distribution of worst case positions 1568 and 1670 (marked with a −) and best case positions 1572 and 1674 (marked with a +) in both a hexagonal and rectangular grid, respectively, according to one embodiment of the present invention. As seen, in a hexagonal exposed spot grid 1564 only a few very specific points 1568 exhibit the worst case impulse response behavior and only under a specific angle. In contrast, in a rectangular exposed spot grid 1660 lines 1670 covering the entire substrate exhibit the worst case impulse response behavior, also under specific, but very common angles only. Thus, it appears in rectangular grid 1660 a number of positions 1670 (i.e., statistically) of the worst case impulse response far exceeds the similar number of positions 1568 in a hexagonal exposed spot grid 1564.

In one example, this can mean that an average performance of the hexagonal grid 1564 is better than the average performance of the rectangular exposed spot grid 1660.

In the datapath simulations, a fit filter is applied for three reasons: (1) to avoid negative solutions (or stated otherwise the need for negative light); (2) To minimize the influence of the sub grid position on the resulting aerial image; and/or (3) to minimize the influence of the angle between an image feature and the exposed spot grid on the resulting aerial image. It is found that for a hexagonal exposed spot grid, higher spatial frequencies can be allowed to enter the spot fit algorithm without increasing the maximum negative solution with respect to the case in which a rectangular exposed spot grid is used.

In one example, a filter is used in the datapath that is designed to reflect a worst case scenario, such that an image has uniform intensity for a worst case scenario.

Thus, image quality can be based on sub grid positioning of spots because quality only changes when not shifting an image a whole number of pixels, e.g., a partial pixel of a sub grid position. For example, if want to position delta pulse exactly aligned with a pixel on a patterning device, then only one pixel on the patterning device need be turned on to produce the delta pulse. However, if a sub grid position is chosen, need to turn on several pixels in the patterning device to form the spot. Thus, must understand the relationship between neighboring pixels in the patterning device to understand what the exact dose of the sub grid spot will be.

Exemplary Exposed Spot Grid Pitch for a Critical Dimension

Figure 17:
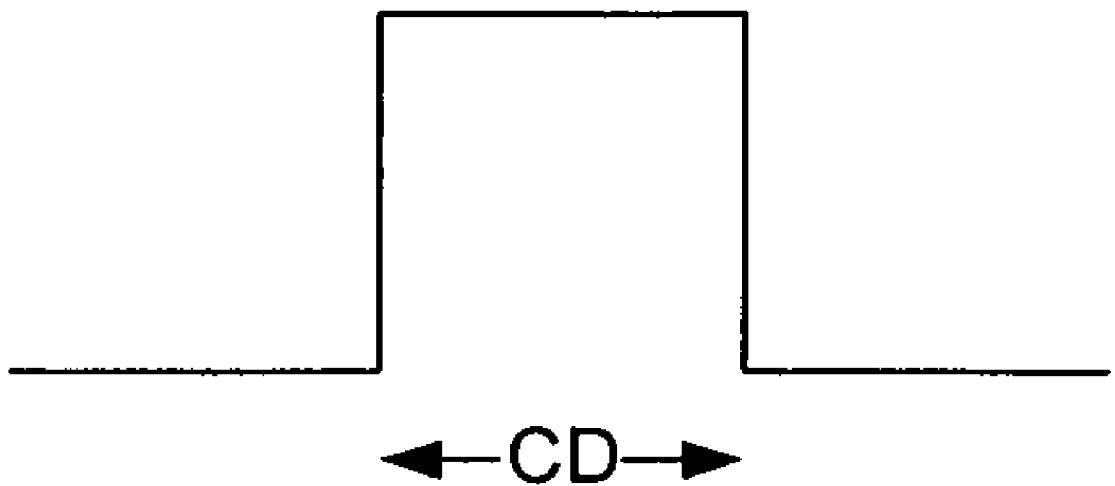
FIG. 17 shows a critical dimension CD of a feature exposed on a substrate, according to one embodiment of the present invention.

FIG. 17 shows a critical dimension CD of a feature exposed on a substrate, according to one embodiment of the present invention. There are multiple definitions of the CD. In one example, what contrast should be generated given a smallest feature size is considered. For example, a requirement can be a CD of about 2.5 μm. In one example, imaging a single rectangular image feature of 1CD width is performed looking at a 1-dimensional case here, however, results hold for 2-dimensions. The Fourier transform of this 1CD wide feature is:

$$\tilde{F}_{CD} = CD \cdot \frac{\sin(0.5 \cdot CD \cdot \omega)}{0.5 \cdot CD \cdot \omega}.$$

The spatial angular frequency at which the frequency amplitude response crosses zero for the first time is $\omega = 2\pi/CD$, when using $\omega = 2\pi/CD$ as the performance criterion. If this spatial frequency is imaged, images with an intensity of 100% can be generated.

Image features with smaller (lower than the CD) dimension with a lower contrast can also be imaged. In the limit of 0% contrast, the feature size is half that for the 100% contrast case. In this limit the Nyquist frequency of the exposed spot grid is achieved.

To be able to image the this spatial frequency $\omega = 2\pi/CD$ using a hexagonal or rectangular exposed spot grid, the following relation holds $$p \leq \frac{1}{2} \cdot CD.$$

This relation can be found by solving the relation $\exp(-j \cdot 0.5 \cdot \omega \cdot p + j \cdot 0.5 \cdot \omega \cdot p)$, which gives the largest angular frequency at which the worst case impulse response amplitude of the grid crosses zero for the first time.

In one example, the exposed spot grid is rectangular with about 1.25 μm nominal exposed spot pitch and individual spot position errors (with respect to its neighbors) of about +/−50 nm maximal. In this example, the maximal exposed spot pitch between two neighboring exposed spots can be about 1.35 μm.

Datapath Implementation Issues

In one example, to maximize data reuse in the datapath neighboring exposed spot intensities are calculated simultaneously. As the change from a rectangular to a hexagonal exposed spot grid changes the relative position of exposed spots with respect to each other, this data reuse is slightly affected. The context radius per exposed spot is about 5 μm. The relative y-distance between the exposed spots $p_{y2}$ is in case of the hexagonal exposed spot pitch is about 625 nm, which exactly equals the algorithm internal calculation grid pitch.

In calculating intensity of one exposed spot, need to use an algorithm that takes into account small part of pattern around this spot. This pattern is larger than the area in which the spot contributes light to. The Algorithm takes the communication between spots into account. Result of this is that in order to calculate intensity of one spot, take area into account roughly 12 microns in diameter, sigma roughly 1 micrometer. If you imaging three spots next to each other, if middle spot contributes to both neighbors, although first and third spots do not see each other, they communicate with each other using the spot in the middle. If have light positioned with respect to the three spots, first spot needs to take pattern of third spot into account because the second stop might or might not be switched on a little to contribute to spot three, if switch on spot two, this contributes to spot one also.

Quasi Hexagonal Exposed Spot Grid Simulation Example

Figure 18:
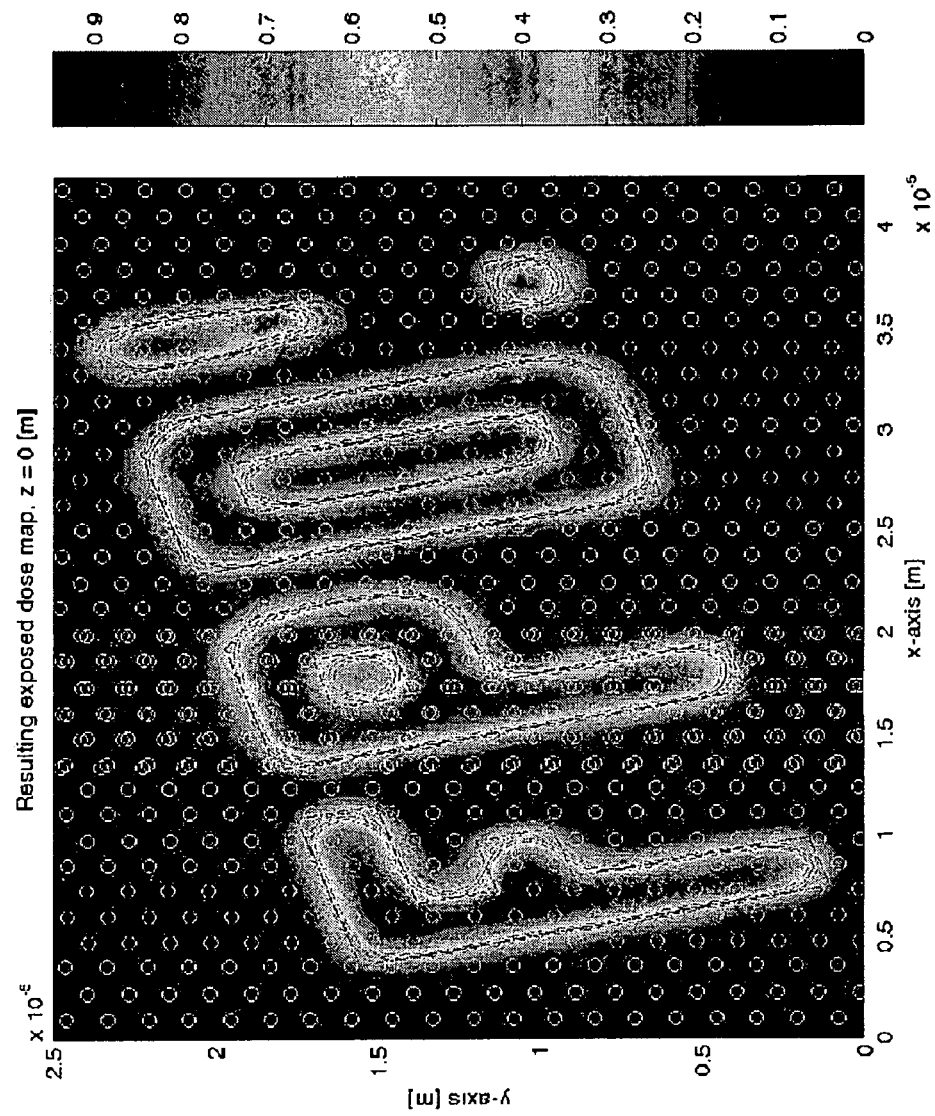
FIGS. 18 and 19 show simulation results for a quasi hexagonal exposed spot grid and a rectangular exposed spot grid, respectively, according to embodiments of the present invention.
Figure 19:
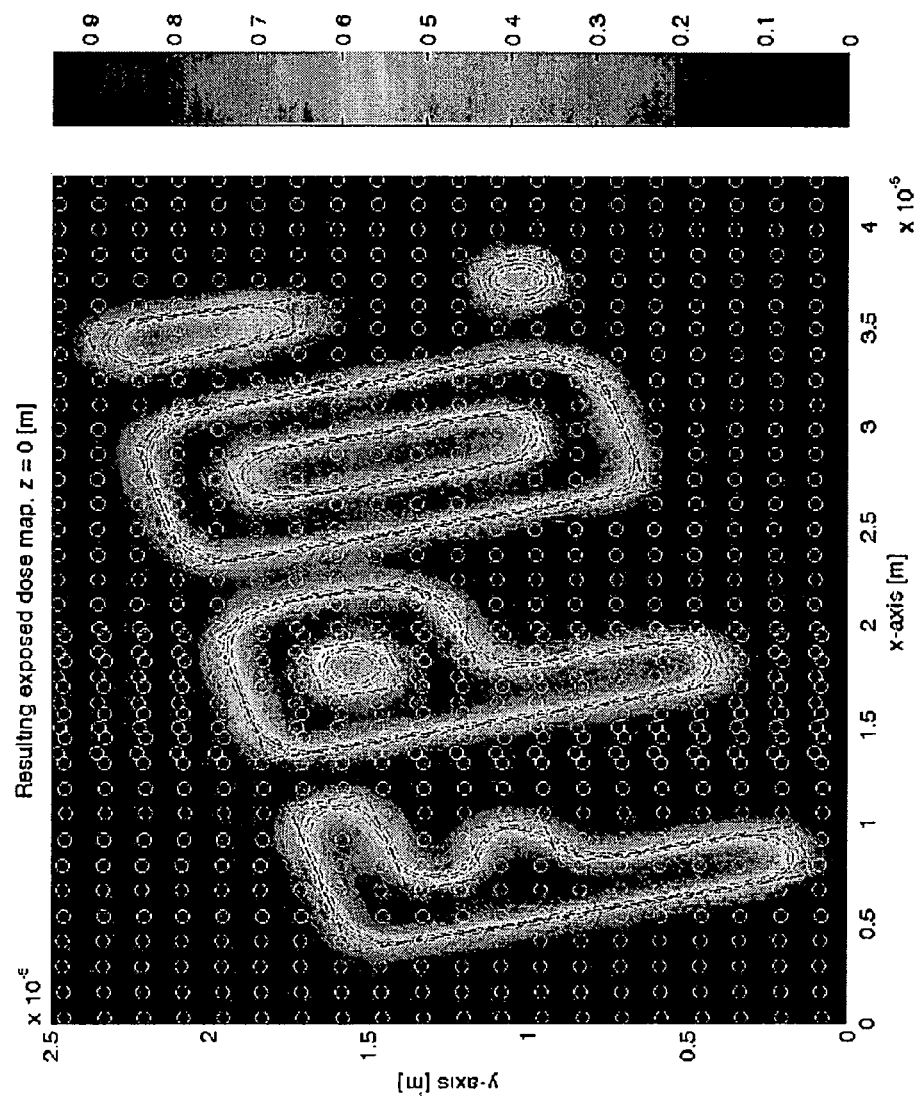

FIGS. 18 and 19 show simulation results for a quasi hexagonal exposed spot grid and a rectangular exposed spot grid, respectively, according to one embodiment of the present invention. Presented in this figure is calculated for the following settings. In this example, the only difference between the nominal rectangular grid parameters and the modified hexagonal grid parameter in this is the scan speed and the fit filter applied is matched for the exposed spot grid geometry. The parameters are: (1) scan speed 62.5 mm/s for a rectangular exposed spot grid and scan speed 62.622 mm/s for a hexagonal exposed spot grid; (2) laser frequency of 50 kHz; and (3) MLA pitch/MLA angle quotient of 1.25 μm.

As compared to rectangular image grids, using hexagonal image grids allows for a reduced sensitivity to of a target image with respect to a spot grid for both a position of the exposed spot and an angle of the exposed spot (e.g., horizontal, vertical, diagonal lines being exposed). Also, as discussed above, a reduction of intensity variation occurs using the hexagonal image grids.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A system, comprising:
    a source of radiation that produces a beam of radiation;
    a patterning device that patterns the beam; and
    a projection system that projects the patterned beam onto a target portion of a substrate, the projection system including a microlens array positioned proximate the substrate and configured to form a substantially hexagonal grid pattern of printed spots on the substrate, wherein a pitch P between the printed spots on the substrate is less than or equal to one of 0.5*CD or CD, wherein CD is a critical dimension of one of the printed spots formed in the hexagonal grid pattern on the substrate, such that a spatial angular frequency ω of the hexagonal grid pattern is $\omega = 2\pi/CD$.

2. The system of claim 1, wherein:
    the patterning device comprises an array of individually controllable elements having a square grid pattern; and
    lenses in the microlens array have a square grid pattern.

3. The system of claim 2, further comprising:
    a controller that controls at least one of a frequency of the source of radiation and a scan speed of a stage that moves the substrate in order to form the hexagonal grid pattern on the substrate.

4. The system of claim 3, wherein when neighboring spots in the hexagonal grid pattern are formed from a same lens in the microlens array, and wherein the at least one of the frequency of the source of radiation and the scan speed of the stage are determined by:

$$Py1 = v_{stage}/f_{laser}$$

wherein $P_y$ is a pitch of the spots in the hexagonal grid pattern in a scan direction, $V_{stage}$ is the scan speed of the stage, and $f_{laser}$ is the frequency of the source of radiation.

5. The system of claim 3, wherein when neighboring spots in the hexagonal grid pattern are formed from different lenses in the microlens array, and wherein the at least one of the frequency of the source of radiation and the scan speed of the stage are determined by:

$$Py2 = [P_{MLA}] \mathrm{mod} [v_{stage}/f_{laser}]$$

wherein $P_y$ is a pitch of the spots in the hexagonal grid pattern in a scan direction, $P_{MLA}$ is a pitch of the lenses in the microlens array, $V_{stage}$ is the scan speed of the stage, and $f_{laser}$ is the frequency of the source of radiation.

6. The system of claim 1, wherein:
    the patterning device comprises an array of individually controllable elements having a hexagonal grid pattern; and
    lenses in the microlens array have a hexagonal grid pattern.

7. The system of claim 1, further comprising:
    a detector that detects spots formed in the hexagonal grid pattern on the substrate; and
    a controller that calculates neighboring spot intensities of the spots formed in the hexagonal grid pattern on the substrate and uses the calculated neighboring spot intensities to generate pattern data used to control the patterning device.

8. A flat panel display formed using the system of claim 1.

9. A method, comprising:
    patterning a beam of radiation from a source of radiation using a patterning device;
    projecting the patterned beam onto a target portion of a substrate using a projection system; and
    forming a substantially hexagonal grid pattern of spots on the substrate using a microlens array in the projection system that is positioned proximate the substrate, wherein a pitch P between the printed spots on the substrate is less than or equal to one of 0.5*CD or CD, wherein CD is a critical dimension of a respective one of the spots formed in the hexagonal grid pattern on the substrate, such that a spatial angular frequency ω of the hexagonal grid pattern is $\omega = 2\pi/CD$.

10. The method of claim 9, further comprising:
    forming the patterning device from an array of individually controllable elements having a square grid pattern; and
    configuring lenses in the microlens array to have a square grid pattern.

11. The method of claim 10, further comprising:
    controlling at least one of a frequency of the source of radiation and a scan speed of a stage that moves the substrate in order to form the hexagonal grid pattern on the substrate.

12. The method of claim 11, wherein when neighboring spots in the hexagonal grid pattern are formed from a same lens in the microlens array, and wherein the at least one of the frequency of the source of radiation and the scan speed of the stage are determined by:

$$Py1 = v_{stage}/f_{laser}$$

wherein $P_y$ is a pitch of the spots in the hexagonal grid pattern in a scan direction, $v_{stage}'$ is the scan speed of the stage, and $f_{laser}$ is the frequency of the source of radiation.

13. The method of claim 11, wherein when neighboring spots in the hexagonal grid pattern are formed from different lenses in the microlens array, and wherein the at least one of the frequency of the source of radiation and the scan speed of the stage are determined by:

$$PY2 = [P_{MLA}] \mathrm{mod} [v_{stage}/f_{laser}]$$

wherein $P_y$ is a pitch of the spots in the hexagonal grid pattern in a scan direction, $P_{MLA}$ is a pitch of the lenses in the microlens array, $v_{stage}$ is the scan speed of the stage, and $f_{laser}$ is the frequency of the source of radiation.

14. The method of claim 9, further comprising:
    forming the patterning device from an array of individually controllable elements having a hexagonal grid pattern; and
    configuring lenses in the microlens array to have a hexagonal grid pattern.

15. The method of claim 9, further comprising:
    detecting spots formed in the hexagonal grid pattern on the substrate;
    calculating neighboring spot intensities of the spots formed in the hexagonal grid pattern on the substrate; and
    using the calculated neighboring spot intensities to generate pattern data used to control the patterning device.

16. A flat panel display formed using the method of claim 9.

* * * * *